(12) United States Patent
Fujisawa et al.

(10) Patent No.: US 6,266,425 B1
(45) Date of Patent: Jul. 24, 2001

(54) AUDIO AMPLIFIER CIRCUIT AND AUDIO DEVICE USING THE CIRCUIT

(75) Inventors: Masanori Fujisawa; Takemi Irokawa, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/433,048

(22) Filed: Nov. 3, 1999

(30) Foreign Application Priority Data

Nov. 4, 1998 (JP) .................................................. 10-313433

(51) Int. Cl.⁷ ....................................................... H03F 21/00
(52) U.S. Cl. ............................................. 381/120; 381/104
(58) Field of Search .................................... 381/120, 104, 381/121, 106, 107; 330/278, 254

(56) References Cited

U.S. PATENT DOCUMENTS 5,260,704 * 11/1993 Hustig ................................... 381/120
5,652,542 * 7/1997 Fink ...................................... 381/120

FOREIGN PATENT DOCUMENTS 4-111506   4/1992   (JP) .
8-222976   8/1996   (JP) .

* cited by examiner

*Primary Examiner*—Minsun Oh Harvey
(74) *Attorney, Agent, or Firm*—Mattingly, Stanger & Malur, P.C.

(57) ABSTRACT

An audio signal amplifier circuit and an audio device are characterized by comprising: an arithmetic circuit which receives digital audio signals and generates in response to digital control signals for sound volume adjustment, calculated digital values corresponding to the sound volume adjustment; a D/A converter circuit which D/A converts the calculated digital values from the arithmetic circuit and generates analogue values; a pulse generating circuit which generates pulses having a predetermined frequency of which generation period is PWM-modulated in response to output analogue values of the D/A converter circuit; and a driving current generating circuit which receives the pulses of the pulse generating circuit and generates current values corresponding to the PWM modulation, and wherein a speaker is driven in response to outputs from the current value generating circuit.

10 Claims, 2 Drawing Sheets

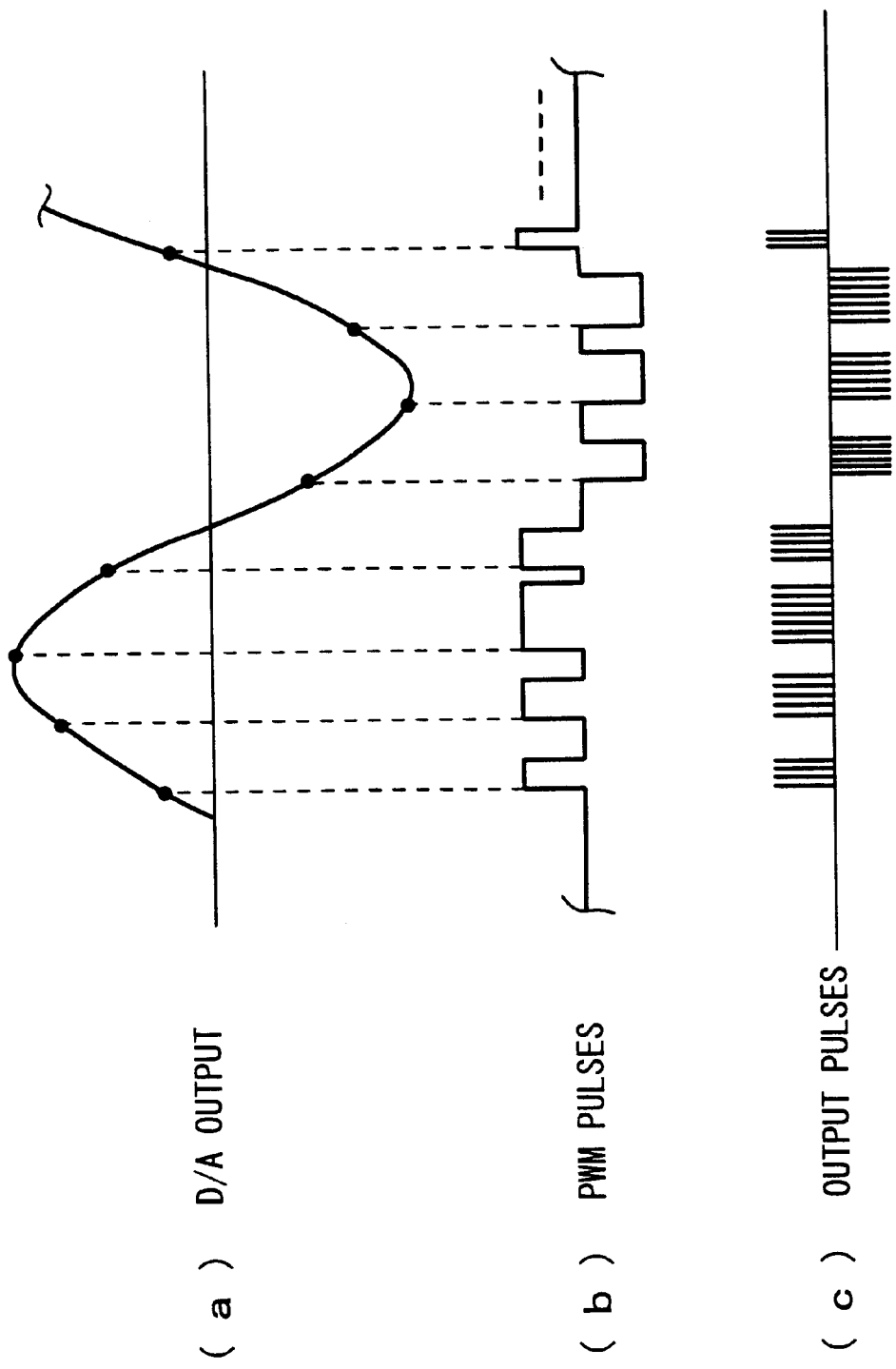

AUDIO AMPLIFIER CIRCUIT AND AUDIO DEVICE USING THE CIRCUIT

BACKGROUND OF THE INVENTION

1. Field of the Invention

The present invention relates to an audio signal amplifier circuit and an audio device using such circuit, and, more specifically, relates to an improvement in an amplifier circuit which converts digital audio signals to analogue audio signals and amplifies the same for a portable audio device such as a portable magnetic tape player, a portable CD player and an audio player making use of an IC memory (an IC memory audio player), which permits to reduce power consumption in the circuit, to operate in a high efficiency and to prolong the playing time of a battery.

2. Background Art

A conventional audio device including a headphone stereo, a portable magnetic tape player for such as DCC and DAT, a portable disk player for such as MD and CD and an IC memory audio player now under development is driven by a battery, and number of batteries therefor is usually about one or two. Therefore, the power source voltage for such audio circuit is only about 1.2V or 2.4V. Moreover, in most cases such device is provided with a stereo function, thus the output amplifier circuit thereof is constituted in two series.

For these portable type audio device, demands for reducing number of driving power source batteries into a single battery and for realizing a longer playing time with a single battery are keen. Further, in such recent circuit a low pass boost amplifier is provided which tends to increase the power consumption.

Portions which consume large electric power in these circuits or the devices are an audio output circuit and a motor device circuit. For example, JP-A-4-111506 (1992) and JP-A-7-222976 (1996) disclose reduction of operating current and suppression of power consumption in an audio circuit. In the former, input signals are applied to a separate power source series other than a signal amplifier series and are full-wave rectified, and the operating current of an audio output circuit is controlled by the full-wave rectified signals, thereby, an electric power depending on the amplitude of the input signals is supplied to the audio output circuit. In the later, an imaginary grounded center amplifier portion when amplifying stereo signals is replaced by a switching regulator to generate a voltage of an imaginary grounded level, thereby, a reduction in power consumption is achieved.

In these sorts of conventional audio amplifier circuits, in particular, such as for a CD or MD portable disk player and an IC memory audio player, digital signals are converted into analogue signals, the converted analogue signals are amplified and dynamic speakers therefor are driven by the amplified analogue output signals. Further, such as in a portable magnetic tape player, reproduced analogue signals are amplified in an analogue form and the speakers are driven by the amplified analogue output signals.

In order to amplify these analogue signals and to drive the dynamic speaker with these analogue output signals, a preamplifier and a sound volume adjusting circuit are required which are operable with signals of from microscopic outputs to power outputs and, thus amplification of audio signals has to be repeated several times. Accordingly, number of capacitors and resistor circuits increases as well as the number of transistors also increases, and the power conversion efficiency up to sound generation remains at most about 60%~70%. It is impossible right now to expect increasing the efficiency more than the above referred to percentage.

Accordingly, a reduction of battery power consumption is limited to a certain level as well as even if the size of concerned circuits is reduced by making use of ICs, the thinning and miniaturizing of the devices are limited.

SUMMARY OF THE INVENTION

An object of the present invention is to resolve these problems of the conventional art and to provide an audio device which permits to reduce power consumption in the circuit, to operate in a high efficiency and to prolong the playing time of a battery.

An audio signal amplifier circuit and an audio device according to the present invention which achieves the above object is characterized, in that the audio signal amplifier circuit and the audio device comprises: an arithmetic circuit which receives digital audio signals and generates in response to digital control signals for sound volume adjustment, calculated digital values corresponding to the sound volume adjustment; a D/A converter circuit which D/A converts the calculated digital values from the arithmetic circuit and generates analogue values; a pulse generating circuit which generates pulses having a predetermined frequency of which generation period is PWM-modulated in response to output analogue values of the D/A converter circuit; and a driving current value generating circuit which receives the pulses of the pulse generating circuit and generates current values corresponding to the PWM modulation, and wherein a speaker is driven in response to outputs from the driving current generating circuit.

According to the present invention as has been explained above, the circuits from the sound volume adjustment to the audio output are constituted by the arithmetic circuit, the D/A converter circuit, the pulse generating circuit and the driving current generating circuit, therefore, it is unnecessary to provide many numbers of capacitors and resistor circuits in the circuits up to the drive signal generation. In particular, since an output amplifier serves as the pulse generating circuit and the output for driving the speaker is generated by the driving current generating circuit which receives the output from the pulse generating circuit, it is unnecessary to amplify analogue signals and to output the same, thus the number of transistors for the circuits is also reduced. Moreover, the sound volume adjustment can be performed directly with digital values, a sound volume adjustment circuit is simplified in comparison with that for analogue signals.

As a result, the electric power conversion efficiency up to the sound generation is improved in comparison with the amplification of analogue signal outputs and a device with a thin and small size can be realized. In particular, an audio device which is suitable for an IC memory audio player can be realized.

BRIEF DESCRIPTION OF THE DRAWINGS

FIG. 2 is a view for explaining operating wave forms in a PWM switching power amplifier.

DESCRIPTION OF THE PREFERRED EMBODIMENT

Figure 1:
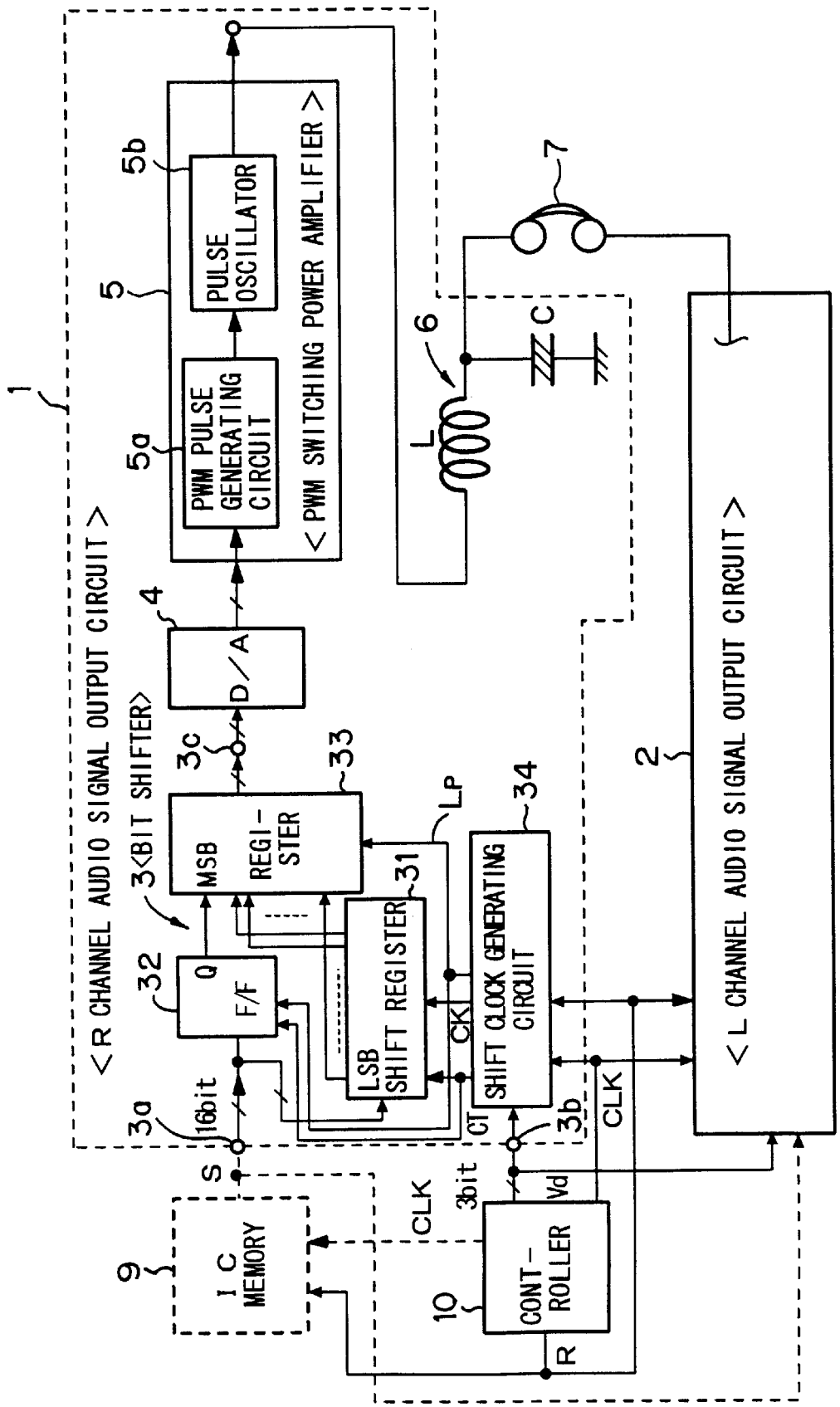
FIG. 1 is a block diagram, primarily a battery driven audio output circuit of one embodiment in which an audio signal amplifier circuit according to the present invention is applied.

In FIG. 1, numeral 1 is an audio signal output circuit in a headphone amplifier for R channel. Since the circuit for L channel is substantially the same as that for R channel, only the circuit for R channel is concretely illustrated, and the audio signal output circuit for L channel is simply illustrated by a black box 2, and hereinbelow only the audio signal output circuit 1 for R channel is explained and an explanation on the audio signal output circuit 2 for L channel is omitted.

Further, numeral 10 is a controller, in that a circuit for generating control signals in digital values in order to adjust such as sound volume of the audio signal output circuits 1 and 2 as well as for generating clock signals CLK. In the drawing illustration of a battery serving as a power source is omitted.

The audio signal output circuit 1 for R channel is constituted by a bit shifter 3, a D/A converter circuit (D/A) 4, a PWM switching power amplifier 5 and a L type filter circuit 6 as a driving current generating circuit, and drives a headphone speaker (right side) 7.

The bit shifter 3 is a so called shift register, in that a multiplier circuit of power of 2. The bit shifter 3 corresponds to a circuit for controlling such as sound volume in an analogue signal amplifier circuit, in that a sound volume adjusting circuit according to sound volume adjustment and receives directly audio digital signals (main signal S) stored in an IC memory at an input terminal 3a. This main signal S (the audio digital signal) is constituted by effective 8 bits, one bit representing positive and negative sign with respect to a reference level and n dummy bits representing "0", wherein n is an integer more than 2. In the present embodiment, n=7 and the seven dummy bits are added at high order digit with respect to the main signal of 8 bits and forms a 16 total bit signal consisting of 15 bits and one bit representing positive or negative sign. This signal is read out from the IC memory 9 by the controller 10.

An input terminal 3b of the bit shifter 3 receives a sound volume control signal Vd of 3 bits from the controller 10 according to sound volume adjustment operation. The bit shifter 3 bit-shifts the main signal S of 8 bits at the input terminal 3b to the high order side by a digital value corresponding to the sound volume control signal Vd of 3 bits received at the input terminal 3b. This bit shift is performed by adding bits of "0" at the low order side and the shifted signal is generated at an output terminal 3c. Further, when the sound volume adjustment is "0", in that under a condition that no sound volume adjustment is required, no bit shift is performed.

More concretely, the bit shifter 3 is constituted by a shift register 31 of 15 bits, a flip-flop (F/F) 32, a register 33 and a shift clock generating circuit 34. The controller 10 generates a read out signal R for the IC memory 9, and in response thereto a read-out signal of 16 bits is supplied to the input terminal 3a of the bit shifter 3. The shift clock generating circuit 34 in the bit shifter 3 receives the read-out signal R as a timing signal from the controller 10 and generates a control signal CT, and in response thereto 15 bits including the main signal S of 8 bits and the dummy bits among the read-out signal are set at the shift register 31 and one bit at the highest order representing positive or negative sign is set at the flip-flop 32. Subsequently, the shift clock generating circuit 33 causes to shift toward high order digit the 8 bits for the main signal S and the dummy bits set at the shift register 31 by the digital value of the sound volume control signal Vd through the control signal CK in response to the clock pulses CLK from the controller 10. For example, when assuming that 8 bit value of the main signal S is "10010010" and the digital value of the sound volume control signal Vd is "011"(=3), the main signal S is shifted toward high order direction by 3 bits. This is performed in such a manner that the shift clock generating circuit 34 receives the value "011" of the sound volume control signal Vd at the input terminal 3b and applies control signals CK in the amount corresponding to three clock pulses CLK from the controller 10 to the shift register 31, and 3 bits of "0" are added to the low order digits of the set data "10010010" to shift the data toward the high order digits. Thereby, 3 dummy bits "0" at high order digits overflow and disappear. As a result, the digital value of the main signal S assumes "10010010000" of 11 bits and the data value in the shift register 31 assumes "000010010010000" of 15 bits. When the shifting by the shift clock generating circuit 34 is ended, a latch pulse Lp is generated from the shift clock generating circuit 34 as illustrated in FIG. 1, and in response to the leading edge of the latch pulse Lp a total 16 bits including the 15 bits from the shift register 31 and one bit from the flip-flop (as the highest order bit) are in parallel set at the register 33. Then, in response to the trailing edge of the latch pulse Lp data of 16 bits (consisting of one bit set at the flip-flop 32, representing positive or negative sign and 15 bits in the shift register 31) are outputted in parallel from the register 33 to the D/A 4. At this time, one bit representing positive or negative sign is outputted as the highest order bit(=MSB) in the same manner when the data is inputted.

In this instance, through one bit shifting the value of main signal S is doubled, therefore, the shifting corresponding to three bit amount multiples the value of the main signal S eight times. In the present embodiment, since the bit number of the sound volume control signal Vd is three bits and the maximum amount thereof is "111"(=7), therefore, the value of the main signal S can be multiplied up to 128 times. Now, when assuming that the output at the output terminal 3c is 16 bits among which one bit is assigned for representing positive or negative sign, 15 bits can be used as effective bits, therefore, 7 bits in maximum can be shifted. Further, when adding one bit representing positive and negative sign with respect to a reference level as an input signal to the main signal S at the input side, the bit number of the main signal S assumes 9 bits. Accordingly, the maximum multiple number of the main signal S reaches up to 128 times thereof, therefore, in maximum an output signal of 128 times can be obtained. However, this implies with regard to amplitude of the signals and the sound volume itself is measured by decibel, thus it never implies that the output sound is multiplied up to 128 times.

The D/A 4 receives such digital value of the bit shifter 3 from the output terminal 3c and converts the same into an analogue signal. Accordingly, through the bit shifting by the bit shifter 3 the output signal can be adjusted in the power of 2 and the sound volume at the time of outputting can be simply adjusted by the digital value.

The analogue output signals of the D/A 4 are inputted to the PWM switching power amplifier 5. The PWM switching power amplifier 5 is constituted by a PWM pulse generating circuit 5a and a pulse oscillator 5b as a switching power circuit which oscillates with pulses of 500 kHz, and is a push-pull output pulse generating circuit which can generate pulses having a predetermined frequency, herein 500 kHz, of which generation period is PWM-modulated depending on the output value of the D/A 4, in both directions of positive side and negative side with respect to a reference voltage. Further, as the predetermined frequency, a frequency of about 100 kHz~1 MHz is preferable.

The PWM pulse generating circuit 5a is, for example, constituted by two triangle wave generating circuits respectively provided for positive side and negative side and respective comparators which compare the respective outputs of the triangle wave generating circuits with the input signals thereof, and receives the output signal of the D/A (see D/A output in FIG. 2(a)) 4 as the input signals therefor and compares the positive and negative amplitude levels thereof with the corresponding positive and negative signal levels in the respective comparators, and in response to the comparison when the signal level in respective positive and negative sides is larger, generates pulses having increased pulse width.

Further, in the above instance the frequency of the triangle wave generating circuit is about 50 kHz which is sufficiently high frequency for audio signals. Still further, in positive side the comparator receives the input signals at (+) input side and receives the triangle wave outputs at (−) input of reference side and in negative side the comparator receives the input signals at (−) input side and receives the triangle wave outputs at (+) input side.

Thus, positive and negative PWM pulses (see PWM pulses in FIG. 2(b)) with respect to a predetermined reference level are generated. The pulse oscillator 5b receives these positive and negative PWM pulses from the PWM pulse generating circuit 5a, and the pulse oscillator 5b generates switching pulses of 500 kHz during the period when the PWM pulses exist and generates a positive pulse in response to the positive analogue value and negative pulse in response to the negative analogue value. As a result, the output pulses of 500 kHz (see FIG. 2(c)) of which pulse generation period is PWM modulated depending on the analogue output signal from the D/A 4 can be obtained from the pulse oscillator 5b. These output pulses are sent to the L type filter circuit 6. Further, actual number of output pulses are more than that illustrated in FIG. 2(c), however, for the sake of explanation convenience, these are illustrated in a simplified manner in FIG. 2(c).

The L type filter circuit 6 is a L type filter in which rear end of a coil L are grounded through a capacitor C and, in particular, with the coil L the PWM signals are converted to driving currents having current values corresponding to the magnitude of the analogue signals. The signals converted into the driving currents are applied to the speaker 7 wherein the current signals are converted into sounds and outputted to the outside.

Further, since the operating frequency of the L type filter circuit 6 converts pulses of 500 kHz to audio frequency, the circuit can be constituted by a passive circuit having a small coil and small capacitors. Still further, in this instance the coil component in the speaker 7 also contributes to the conversion into the current values.

In the above referred to circuits, no output amplifier circuit is included and the sound volume can be adjusted by digital values, therefore, the entire circuit structure from the sound volume adjustment circuit to the audio output amplifier is simplified.

Now, in the above explained embodiment, the positive and negative sign bit is provided at the highest order bit (=MSB) and the highest order bit is stored in the flip-flop of the bit shifter, and thus the bits for the main signal S are bit-shifted depending on the sound volume with the single shift register, however, as an alternative thereto the flip-flop can be eliminated, and instead thereof shift registers can be provided for respective positive side and negative side and are to be selected depending on the positive and negative sign of the concerned bit. In such modification, the highest order bit of one of selected shift register is always "1" and the highest order bit of the other is always "0".

Further, in the above explained embodiment, the bit shifter is used for the sound volume adjustment which is employed for simplifying the circuit structure, however, instead of such bit shifter any means can be of course used which can calculate values of main signals by the sound volume adjustment circuit with such as a digital multiplier and an arithmetic circuit in which a predetermined numerical value is multiplied or added according to the control values. Further, a circuit with a coil can be used as the L type passive filter circuit, therefore, other circuit having a coil component can be served as the L type filter circuit. When the coil component of a speaker has a large inductance component, the speaker can be used as the filter circuit as it is.

Still further, by adding a positive and negative control sign of one bit to the sound volume control signal Vd of 3 bits according to the above explained embodiment and, as the sound volume adjustment, by shifting the same in the low order direction, the value of the main signal S is reduced by power. Thereby, the sound volume can be reduced to "0" or restricted. These sound volume control signals Vd can be two bit signals as well as can be more than three bit signals.

What is claimed is:

1. An audio amplifier circuit which converts digital audio signals into analogue audio signals and amplifies the same comprising:

an arithmetic circuit which receives the digital audio signals and generates in response to digital control signals for sound volume adjustment, calculated digital values corresponding to the sound volume adjustment;

a D/A converter circuit which D/A converts the calculated digital values from said arithmetic circuit and generates analogue values;

a pulse generating circuit which generates pulses having a predetermined frequency of which generation period is PWM-modulated in response to the output analogue values of said D/A converter circuit; and a driving current generating circuit which receives the pulses of said pulse generating circuit and generates current values corresponding to the PWM modulation, and wherein a speaker is driven in response to outputs from said driving current generating circuit.

2. An audio amplifier circuit according to claim 1, wherein said arithmetic circuit is a multiplier circuit, said driving current generating circuit is a passive filter circuit having a coil and said pulse generating circuit is a switching power circuit of which switching period prolongs depending on the magnitude of the output analogue values from said D/A converter circuit.

3. An audio amplifier circuit according to claim 2, wherein said multiplier circuit is a bit shifter.

4. An audio amplifier circuit according to claim 3, wherein the digital audio signals are ones read out from an IC memory, in the data read out from the IC memory n pieces of dummy bits are added at high order digit side, wherein n is an integer equal to 2 or more than 2, and the bit shifter includes a shift register, sets the digital audio signal to which the dummy bits of n pieces are added into the shift register and shifts the data in the shift register toward high order digit direction in response to the digital control signals.

5. An audio amplifier circuit according to claim 4, wherein the highest order bit of the digital audio signal is a bit representing positive and negative sign of a value and the positive and negative sign bit is outputted as the highest order bit to said D/A converter without being shifted, said D/A converter generates positive analogue values in response to said positive sign and negative analogue values in response to said negative sign and said switching power circuit generates a positive pulse in response to said positive analogue value and a negative pulse in response to said negative analogue value.

6. An audio device which converts digital audio signals into analogue audio signals and amplifies the same comprising:

an audio amplifier circuit including an arithmetic circuit which receives the digital audio signals and generates in response to digital control signals for sound volume adjustment, calculated digital values corresponding to the sound volume adjustment; a D/A converter circuit which D/A converts the calculated digital values from the arithmetic circuit and generates analogue values; a pulse generating circuit which generates pulses having a predetermined frequency of which generation period is PWM-modulated in response to output analogue values of the D/A converter circuit; and a driving current generating circuit which receives the pulses of the pulse generating circuit and generates current values corresponding to the PWM modulation;

a controller which generates the control signals depending on the sound volume adjustment operation; and a speaker which is driven in response to outputs from the driving current generating circuit.

7. An audio device according to claim 6, wherein said arithmetic circuit is a multiplier circuit, said current value generating circuit is a passive filter circuit having a coil and said pulse generating circuit is a switching power circuit of which switching period prolongs depending on the magnitude of the output analogue values from said D/A converter circuit.

8. An audio device according to claim 7, wherein said multiplier circuit is a bit shifter.

9. An audio device according to claim 8, wherein the digital audio signals are ones read out from an IC memory, in the data read out from the IC memory n pieces of dummy bits are added at high order digit side, wherein n is an integer equal to 2 or more than 2, and the bit shifter includes a shift register, sets the digital audio signal to which the dummy bits of n pieces are added into the shift register and shifts the data in the shift register toward high order digit direction in response to the digital control signals.

10. An audio device according to claim 9, wherein the highest order bit of the digital audio signal is a bit representing positive and negative sign of a value and the positive and negative sign bit is outputted as the highest order bit to said D/A converter without being shifted, said D/A converter generates positive analogue values in response to said positive sign and negative analogue values in response to said negative sign and said switching power circuit generates a positive pulse in response to said positive analogue value and a negative pulse in response to said negative analogue value.

* * * * *